(12) United States Patent
Paseuth et al.

(10) Patent No.: US 11,311,945 B2
(45) Date of Patent: *Apr. 26, 2022

(54) SURFACE-COATED CUTTING TOOL AND METHOD FOR MANUFACTURING SAME

(71) Applicant: Sumitomo Electric Hardmetal Corp., Itami (JP)

(72) Inventors: Anongsack Paseuth, Itami (JP); Yasuki Kido, Itami (JP); Susumu Okuno, Itami (JP); Shinya Imamura, Itami (JP)

(73) Assignee: Sumitomo Electric Hardmetal Corp., Itami (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/482,068

(22) PCT Filed: Dec. 27, 2018

(86) PCT No.: PCT/JP2018/048019
§ 371 (c)(1),
(2) Date: Jul. 30, 2019

(87) PCT Pub. No.: WO2019/181135
PCT Pub. Date: Sep. 26, 2019

(65) Prior Publication Data
US 2020/0376566 A1 Dec. 3, 2020

(30) Foreign Application Priority Data
Mar. 22, 2018 (JP) .............................. JP2018-054715

(51) Int. Cl.
*C23C 16/34* (2006.01)
*B23B 27/14* (2006.01)
*B23C 5/16* (2006.01)

(52) U.S. Cl.
CPC ................ *B23B 27/14* (2013.01); *B23C 5/16* (2013.01); *C23C 16/34* (2013.01)

(58) Field of Classification Search
CPC ............ C23C 16/34; B23C 5/16; B23B 27/14
See application file for complete search history.

(56) References Cited

U.S. PATENT DOCUMENTS 7,357,975 B2 * 4/2008 Vetter ..................... B32B 19/00
106/286.1
10,875,101 B2 * 12/2020 Paseuth ................. B23B 27/148
(Continued)

FOREIGN PATENT DOCUMENTS

CN    107771225 A    3/2018
JP    2008-055526 A    3/2008
(Continued)

OTHER PUBLICATIONS

J. Keckes, et al., "Self-organized periodic soft-hard nanolamellae in polycrystalline TiAlN thin films," Thin Solid Films, Aug. 9, 2013, No. 545, pp. 29-32.
(Continued)

*Primary Examiner* — Elizabeth A Burkhart
(74) *Attorney, Agent, or Firm* — Baker Botts L.L.P.; Michael A. Sartori

(57) ABSTRACT

A surface-coated cutting tool includes a substrate and a coating film that coats the substrate, wherein the coating film includes a hard coating layer constituted of a domain region and a matrix region, the domain region is a region having a plurality of portions divided and distributed in the matrix region, the domain region has a structure in which a first layer composed of a first $Al_{x1}Ti_{(1-x1)}$ compound and a second layer composed of a second $Al_{x2}Ti_{(1-x2)}$ compound are layered on each other, the matrix region has a structure in which a third layer composed of a third $Al_{x3}Ti_{(1-x3)}$ compound and a fourth layer composed of a fourth $Al_{x4}Ti_{(1-x4)}$ compound are layered on each other, the first AlTi compound and the third AlTi compound have a hexagonal crystal (Continued)

structure, the second AlTi compound and the fourth AlTi compound have a cubic crystal structure.

5 Claims, 3 Drawing Sheets

(56) References Cited

U.S. PATENT DOCUMENTS

| | | | |
|---|---|---|---|
| 2009/0123779 A1 | 5/2009 | Endler | |
| 2015/0064452 A1* | 3/2015 | Pitonak | C23C 30/005 |
| | | | 428/336 |
| 2015/0345013 A1* | 12/2015 | Paseuth | C23C 16/56 |
| | | | 428/329 |
| 2016/0040285 A1 | 2/2016 | Tatsuoka et al. | |
| 2016/0193662 A1 | 7/2016 | Park et al. | |
| 2016/0333473 A1 | 11/2016 | Stiens et al. | |
| 2017/0021429 A1* | 1/2017 | Paseuth | C23C 16/52 |
| 2018/0023194 A1 | 1/2018 | Pitonak et al. | |
| 2018/0135168 A1 | 5/2018 | Paseuth et al. | |
| 2019/0111497 A1* | 4/2019 | Stiens | B23B 27/148 |

FOREIGN PATENT DOCUMENTS

| | | |
|---|---|---|
| JP | 2008545063 A | 12/2008 |
| JP | 2014-121747 A | 7/2014 |
| JP | 2014133267 A | 7/2014 |
| JP | 2014210313 A | 11/2014 |
| JP | 2015509858 A | 4/2015 |
| JP | 2015124407 A | 7/2015 |
| JP | 2016130343 A | 7/2016 |
| JP | 6995091 B2 | 9/2016 |
| JP | 2017508632 A | 3/2017 |
| JP | 2018504515 A | 2/2018 |
| KR | 10-2010-0014705 A | 2/2010 |
| KR | 10-2015-0138246 A | 12/2015 |
| WO | 2008/120185 A1 | 10/2008 |
| WO | 2017/016826 A1 | 2/2017 |
| WO | 2017/175398 A1 | 10/2017 |

OTHER PUBLICATIONS

U.S. Appl. No. 16/482,150, filed Jul. 30, 2019.
U.S. Appl. No. 16/482,118, filed Jul. 30, 2019.
U.S. Appl. No. 16/482,156, filed Jul. 30, 2019.
Notice of Allowance issued in U.S. Appl. No. 16/482,150 dated Sep. 21, 2020.
Office Action issued in U.S. Appl. No. 16/482,118 dated Jan. 8, 2021.
Notice of Allowance issued in U.S. Appl. No. 16/482,118 dated Apr. 15, 2021.
Notice of Allowance issued in U.S. Appl. No. 16/482,118 dated May 13, 2021.
Notice of Allowance issued in U.S. Appl. No. 16/482,118 dated Aug. 5, 2021.
Notice of Allowance issued in U.S. Appl. No. 16/482,156 dated Jan. 14, 2022.

* cited by examiner

SURFACE-COATED CUTTING TOOL AND METHOD FOR MANUFACTURING SAME

TECHNICAL FIELD

The present disclosure relates to a surface-coated cutting tool and a method for manufacturing the surface-coated cutting tool. The present application claims a priority based on Japanese Patent Application No. 2018-054715 filed on Mar. 22, 2018, the entire content of which is incorporated herein by reference.

BACKGROUND ART

Conventionally, a cutting tool composed of cemented carbide has been used to cut steel, casting, or the like. During the cutting, the cutting edge of such a cutting tool is exposed to a severe environment such as high temperature and high stress, thus resulting in wear and breakage of the cutting edge.

Therefore, in order to improve the life of the cutting tool, it is important to suppress the wear and breakage of the cutting edge.

In order to improve cutting performance of the cutting tool, coating films, each of which coats a surface of a substrate composed of cemented carbide or the like, have been developed. Among them, a coating film composed of a compound (hereinafter, also referred to as "AlTiN") of aluminum (Al), titanium (Ti), and nitrogen (N) can have high hardness, and can have improved oxidation resistance by increasing a content ratio of Al (for example, Japanese National Patent Publication No. 2015-509858 (Patent Literature 1), Japanese National Patent Publication No. 2017-508632 (Patent Literature 2), and Japanese Patent Laying-Open No. 2016-130343 (Patent Literature 3)).

CITATION LIST

Patent Literature

PTL 1: Japanese National Patent Publication No. 2015-509858
PTL 2: Japanese National Patent Publication No. 2017-508632
PTL 3: Japanese Patent Laying-Open No. 2016-130343

SUMMARY OF INVENTION

A surface-coated cutting tool according to the present disclosure is a surface-coated cutting tool including a substrate and a coating film that coats the substrate, wherein
the coating film includes a hard coating layer constituted of a domain region and a matrix region,
the domain region is a region having a plurality of portions divided and distributed in the matrix region,
the domain region has a structure in which a first layer and a second layer are layered on each other, the first layer being composed of at least one first AlTi compound selected from a group consisting of $Al_{x1}Ti_{(1-x1)}N$, $Al_{x1}Ti_{(1-x1)}BN$, and $Al_{x1}Ti_{(1-x1)}CN$, the second layer being composed of at least one second AlTi compound selected from a group consisting of $Al_{x2}Ti_{(1-x2)}N$, $Al_{x2}Ti_{(1-x2)}BN$, and $Al_{x2}Ti_{(1-x2)}CN$,
the matrix region has a structure in which a third layer and a fourth layer are layered on each other, the third layer being composed of at least one third AlTi compound selected from a group consisting of $Al_{x3}Ti_{(1-x3)}N$, $Al_{x3}Ti_{(1-x3)}BN$, and $Al_{x3}Ti_{(1-x3)}CN$, the fourth layer being composed of at least one fourth AlTi compound selected from a group consisting of $Al_{x4}Ti_{(1-x4)}N$, $Al_{x4}Ti_{(1-x4)}BN$, and $Al_{x4}Ti_{(1-x4)}CN$,
the first AlTi compound has a hexagonal crystal structure, and the second AlTi compound has a cubic crystal structure,
the third AlTi compound has a hexagonal crystal structure, and the fourth AlTi compound has a cubic crystal structure,
x1 is more than or equal to 0.89 and less than or equal to 0.97,
x2 is more than or equal to 0.5 and less than or equal to 0.61,
x3 is more than or equal to 0.86 and less than or equal to 0.95, and
x4 is more than or equal to 0.5 and less than or equal to 0.65.

A method for manufacturing a surface-coated cutting tool according to the present disclosure is a method for manufacturing the above-described surface-coated cutting tool, and includes:
preparing the substrate; and
emitting first gas, second gas, and third gas to the substrate in an atmosphere at more than or equal to 650° C. and less than or equal to 900° C. and under more than or equal to 0.5 kPa and less than or equal to 5 kPa, the first gas including aluminum halide gas and titanium halide gas, the second gas including aluminum halide gas, titanium halide gas, and ammonia gas, the third gas including ammonia gas.

BRIEF DESCRIPTION OF DRAWINGS

FIG. 2 shows an exemplary enlarged photograph of a region a.

DETAILED DESCRIPTION

Figure 1:
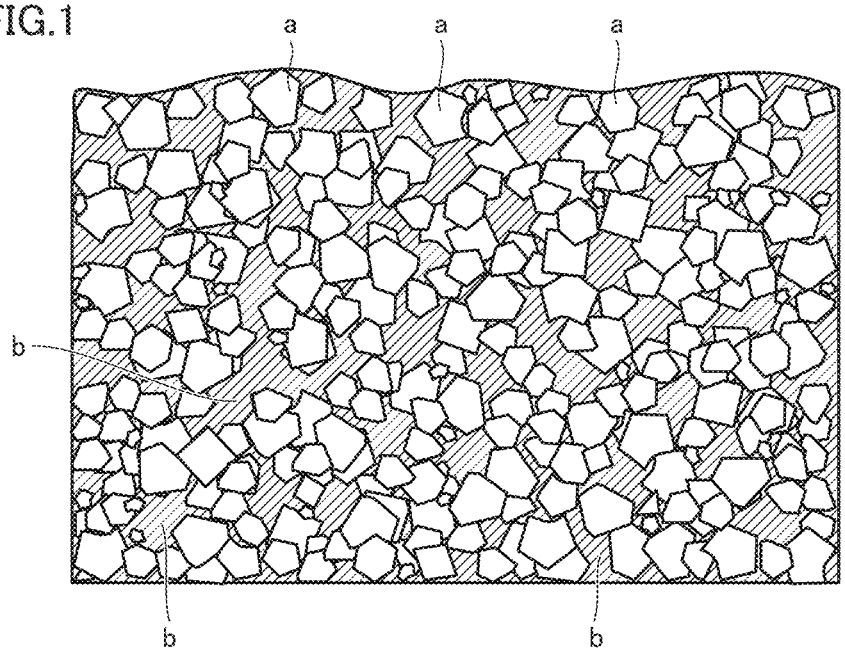
FIG. 1 is a schematic view of a hard coating layer included in a coating film of a surface-coated cutting tool according to the present embodiment.

Problem to be Solved by the Present Disclosure

In recent years, more efficient cutting (with an increased feed rate) has been required. It has been expected to further improve breakage resistance and wear resistance (suppress breakage and wear of a cutting edge).

The present disclosure has been made in view of the above-described circumstance, and has an object to provide a surface-coated cutting tool having excellent breakage resistance and wear resistance.

Advantageous Effect of the Present Disclosure

According to the description above, there can be provided a surface-coated cutting tool having excellent breakage resistance and wear resistance.

DESCRIPTION OF EMBODIMENTS

First, contents of one embodiment of the present disclosure are listed and described.

[1] A surface-coated cutting tool according to the present disclosure is a surface-coated cutting tool including a substrate and a coating film that coats the substrate, wherein
the coating film includes a hard coating layer constituted of a domain region and a matrix region,
the domain region is a region having a plurality of portions divided and distributed in the matrix region,
the domain region has a structure in which a first layer and a second layer are layered on each other, the first layer being composed of at least one first AlTi compound selected from a group consisting of $Al_{x1}Ti_{(1-x1)}N$, $Al_{x1}Ti_{(1-x1)}BN$, and $Al_{x1}Ti_{(1-x1)}CN$, the second layer being composed of at least one second AlTi compound selected from a group consisting of $Al_{x2}Ti_{(1-x4)}N$, $Al_{x4}Ti_{(1-x4)}BN$, and $Al_{x4}Ti_{(1-x4)}CN$,
the matrix region has a structure in which a third layer and a fourth layer are layered on each other, the third layer being composed of at least one third AlTi compound selected from a group consisting of $Al_{x3}Ti_{(1-x3)}N$, $Al_{x3}Ti_{(1-x3)}BN$, and $Al_{x3}Ti_{(1-x3)}CN$, the fourth layer being composed of at least one fourth AlTi compound selected from a group consisting of $Al_{x4}Ti_{(1-x4)}N$, $Al_{x4}Ti_{(1-x4)}BN$, and $Al_{x4}Ti_{(1-x4)}CN$,
the first AlTi compound has a hexagonal crystal structure, and the second AlTi compound has a cubic crystal structure,
the third AlTi compound has a hexagonal crystal structure, and the fourth AlTi compound has a cubic crystal structure,
x1 is more than or equal to 0.89 and less than or equal to 0.97,
x2 is more than or equal to 0.5 and less than or equal to 0.61,
x3 is more than or equal to 0.86 and less than or equal to 0.95, and
x4 is more than or equal to 0.5 and less than or equal to 0.65.

Since the surface-coated cutting tool is configured as described above, the surface-coated cutting tool can have excellent breakage resistance and wear resistance.

[2] The domain region includes a twin crystal portion. By defining in this way, the surface-coated cutting tool has excellent chipping resistance.

[3] A total thickness of a thickness of the first layer and a thickness of the second layer is more than or equal to 2 nm and less than or equal to 20 nm. By defining in this way, the surface-coated cutting tool has excellent wear resistance.

[4] A total thickness of a thickness of the third layer and a thickness of the fourth layer is more than or equal to 1.5 nm and less than or equal to 30 nm. By defining in this way, the surface-coated cutting tool has excellent breakage resistance.

[5] A method for manufacturing a surface-coated cutting tool according to the present disclosure is a method for manufacturing the above-described surface-coated cutting tool, and includes:
preparing the substrate; and
emitting first gas, second gas, and third gas to the substrate in an atmosphere at more than or equal to 650° C. and less than or equal to 900° C. and under more than or equal to 0.5 kPa and less than or equal to 5 kPa, the first gas including aluminum halide gas and titanium halide gas, the second gas including aluminum halide gas, titanium halide gas, and ammonia gas, the third gas including ammonia gas.

Since the method for manufacturing the surface-coated cutting tool is configured as described above, a surface-coated cutting tool having excellent breakage resistance and wear resistance can be manufactured.

Details of Embodiments of the Present Disclosure

The following describes one embodiment (hereinafter, referred to as "the present embodiment") of the present disclosure. However, the present embodiment is not limited thereto. It should be noted that the same reference characters indicate the same or equivalent portions in the figures used for the below description of the embodiment. In the present specification, the expression "A to B" represents a range of lower to upper limits (i.e., more than or equal to A and less than or equal to B). When no unit is indicated for A and a unit is indicated only for B, the unit of A is the same as the unit of B. Further, in the present specification, when a compound is expressed by a chemical formula in which a composition ratio of composition elements is not limited such as "TiC", it is assumed that the chemical formula includes all the conventionally known composition ratios (element ratios). In this case, it is assumed that the above-described chemical formula includes not only a stoichiometric composition but also a non-stoichiometric composition. For example, the chemical formula "TiC" includes not only a stoichiometric composition "$Ti_1C_1$" but also a non-stoichiometric composition such as "$Ti_1C_{0.8}$". The same also applies to compounds other than the "TiC".

<<Surface-Coated Cutting Tool>>

A surface-coated cutting tool according to the present embodiment is a surface-coated cutting tool including a substrate and a coating film that coats the substrate, wherein
the coating film includes a hard coating layer constituted of a domain region and a matrix region,
the domain region is a region having a plurality of portions divided and distributed in the matrix region,
the domain region has a structure in which a first layer and a second layer are layered on each other, the first layer being composed of at least one first AlTi compound selected from a group consisting of $Al_{x1}Ti_{(1-x1)}N$, $Al_{x1}Ti_{(1-x1)}BN$, and $Al_{x1}Ti_{(1-x1)}CN$, the second layer being composed of at least one second AlTi compound selected from a group consisting of $Al_{x2}Ti_{(1-x2)}N$, $Al_{x2}Ti_{(1-x2)}BN$, and $Al_{x2}Ti_{(1-x2)}CN$,
the matrix region has a structure in which a third layer and a fourth layer are layered on each other, the third layer being composed of at least one third AlTi compound selected from a group consisting of $Al_{x3}Ti_{(1-x3)}N$, $Al_{x3}Ti_{(1-x3)}BN$, and $Al_{x3}Ti_{(1-x3)}CN$, the fourth layer being composed of at least one fourth AlTi compound selected from a group consisting of $Al_{x4}Ti_{(1-x4)}N$, $Al_{x4}Ti_{(1-x4)}BN$, and $Al_{x4}Ti_{(1-x4)}CN$,
the first AlTi compound has a hexagonal crystal structure, and the second AlTi compound has a cubic crystal structure,
the third AlTi compound has a hexagonal crystal structure, and the fourth AlTi compound has a cubic crystal structure,
x1 is more than or equal to 0.89 and less than or equal to 0.97,
x2 is more than or equal to 0.5 and less than or equal to 0.61, x3 is more than or equal to 0.86 and less than or equal to 0.95, and x4 is more than or equal to 0.5 and less than or equal to 0.65.

The surface-coated cutting tool (hereinafter, also simply referred to as "cutting tool") of the present embodiment includes the substrate and the coating film that coats the substrate. Examples of the cutting tool include a drill, an end mill, an indexable cutting insert for drill, an indexable cutting insert for end mill, an indexable cutting insert for milling, an indexable cutting insert for turning, a metal saw, a gear cutting tool, a reamer, a tap, and the like.

<Substrate>

For the substrate of the present embodiment, any conventionally known substrate can be used. For example, the substrate preferably includes at least one selected from a group consisting of a cemented carbide (for example, a tungsten carbide (WC) based cemented carbide, a cemented carbide including Co in addition to WC, or a cemented carbide having a carbonitride of Cr, Ti, Ta, and Nb, or the like added therein in addition to WC); a cermet (including TiC, TiN, TiCN, or the like as a main component); a high-speed steel, a ceramic (titanium carbide, silicon carbide, silicon nitride, aluminum nitride, aluminum oxide, or the like); a cubic boron nitride sintered material (cBN sintered material); and a diamond sintered material. The substrate more preferably includes at least one selected from a group consisting of the cemented carbide, the cermet, and the cBN sintered material.

Among these various substrates, it is particularly preferable to select the WC based cemented carbide or the cBN sintered material. This is due to the following reason: each of these substrates is excellent in balance between hardness and strength particularly at a high temperature, and has an excellent characteristic as a substrate of a surface-coated cutting tool for the above-described purpose of use.

When the cemented carbide is used as the substrate, the effects of the present embodiment are achieved even if the cemented carbide includes free carbon or an abnormal phase called η phase in the structure thereof. It should be noted that the substrate used in the present embodiment may have a modified surface. For example, in the case of the cemented carbide, a β-free layer may be formed on the surface. In the case of the cBN sintered material, a surface hardening layer may be formed. Even when the surface is thus modified, the effects of the present embodiment are exhibited.

When the surface-coated cutting tool is an indexable cutting insert, a substrate having a chip breaker or a substrate having no chip breaker may be included. For the shape of a ridgeline portion of the cutting edge, any of the following shapes is included: a sharp edge (ridge at which a rake face and a flank face cross each other); a honing (shape obtained by providing a curvature to the sharp edge); a negative land (chamfered shape); and a shape obtained by combining the honing and the negative land.

<Coating Film>

The coating film according to the present embodiment includes a hard coating layer constituted of a domain region and a matrix region. The "coating film" has a function of improving various characteristics in the cutting tool such as breakage resistance, wear resistance, and the like by coating at least a portion (for example, a portion to be brought into contact with a workpiece during cutting) of the substrate. The coating film preferably coats the entire surface of the substrate. However, a coating film that does not coat a portion of the substrate and a coating film having a partially different configuration are not deviated from the scope of the present embodiment.

The thickness of the coating film is preferably more than or equal to 2 µm and less than or equal to 20 µm, and is more preferably more than or equal to 5 µm and less than or equal to 15 µm. Here, the thickness of the coating film refers to a total of respective thicknesses of layers included in the coating film. Examples of the "layers included in the coating film" include a hard coating layer, a foundation layer, an outermost layer, and the like, which are described below. The thickness of the coating film can be determined, for example, as follows: a transmission electron microscope (TEM) is used to measure thicknesses at ten arbitrary points in a cross sectional sample parallel to the normal direction of the surface of the substrate, and the average value of the measured thicknesses at the ten points is determined. The same applies to respective measurements of thicknesses of the hard coating layer, the foundation layer, and the outermost layer, which are described below. Examples of the transmission electron microscope include JEM-2100F (trademark) provided by JEOL Ltd.

(Hard Coating Layer)

FIG. 1 is a schematic view of the hard coating layer included in the coating film of the surface-coated cutting tool according to the present embodiment. The hard coating layer is constituted of the above-described domain region (region a in FIG. 1) and the above-described matrix region (region b in FIG. 1 (region other than region a)). In FIG. 1, portions of domain region a appear to overlap with each other; however, domain region a includes portions between which matrix region b is interposed in the depth direction of the figure. Although the hard coating layer has a blow-described composition, an inevitable impurity may be included as long as the effects exhibited by the surface-coated cutting tool according to the present embodiment are not compromised. The content ratio of the inevitable impurity is preferably more than or equal to 0 mass % and less than or equal to 10 mass % relative to the total mass of the hard coating layer.

The hard coating layer may be provided directly on the substrate or may be provided on the substrate with another layer such as the foundation layer being interposed therebetween as long as the effects exhibited by the surface-coated cutting tool according to the present embodiment are not compromised. On the hard coating layer, another layer such as an outermost layer may be provided. Moreover, the hard coating layer may be the outermost layer (outermost surface layer) of the coating film.

The thickness of the hard coating layer is preferably more than or equal to 0.5 µm and less than or equal to 15 µm, and is more preferably more than or equal to 3 µm and less than or equal to 13 µm.

(Domain Region)

The term "domain region" in the present embodiment refers to a region (for example, region a in FIG. 1) having a plurality of portions divided and distributed in the below-described matrix region. Moreover, it can be also understood that the domain region is a region divided into a plurality of regions in the hard coating layer. It should be noted that the "distributed" state above does not exclude a state in which regions of the domain region are in contact with each other. The domain region has a structure in which a first layer and a second layer are alternately layered on each other, the first layer being composed of at least one first AlTi compound selected from a group consisting of $Al_{x1}Ti_{(1-x1)}N$, $Al_{x1}Ti_{(1-x1)}BN$, and $Al_{x1}Ti_{(1-x1)}CN$, the second layer being composed of at least one second AlTi compound selected from a group consisting of $Al_{x2}Ti_{(1-x2)}N$, $Al_{x2}Ti_{(1-x2)}BN$, and $Al_{x2}Ti_{(1-x2)}CN$. Here, x1 represents an atomic ratio of Al in the first layer and x2 represents an atomic ratio of Al in the second layer. The first AlTi compound is preferably $Al_{x1}Ti_{(1-x1)}N$. Moreover, the second AlTi compound is preferably $Al_{x2}Ti_{(1-x2)}N$.

Figure 2:
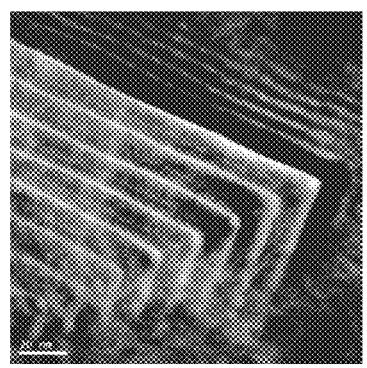

FIG. 2 shows an exemplary enlarged photograph of region a. A multilayer structure may be formed in which one or more first layers (dark layers in FIG. 2) and one or more second layers (bright layers in FIG. 2) are layered alternately on each other. In the present embodiment, the domain region may have a portion including such a multilayer structure. Alternatively, the domain region may be constituted of such a multilayer structure.

The domain region can be clearly distinguished from the below-described matrix region by way of observation with a TEM and a selected area electron diffraction image analysis.

Although the volume ratio of the domain region is not particularly limited, the volume ratio of the domain region may be more than or equal to 10 volume % and less than or equal to 90 volume %, may be more than or equal to 20 volume % and less than or equal to 80 volume %, or may be more than or equal to 50 volume % and less than or equal to 80 volume % with respect to the total volume of the domain region and the matrix region. The volume ratio of the domain region is determined by performing X-ray diffraction measurement (XRD measurement) and Rietveld analysis. For example, when the surface-coated cutting tool is an indexable cutting insert, the XRD measurement is performed in accordance with conditions described in Table 10 below. On this occasion, each of regions to be measured is preferably a flat region within 2 mm from a ridgeline of the indexable cutting insert. It is preferable to select two regions to be measured, and perform measurement twice or more for each region. Then, the obtained data is subjected to the Rietveld analysis, thereby determining the volume ratio of the domain region.

The thickness of the first layer is preferably more than or equal to 2 nm and less than or equal to 20 nm, and is more preferably more than or equal to 4 nm and less than or equal to 14 nm. The thickness of the second layer is preferably more than or equal to 0.5 nm and less than or equal to 5 nm, and is more preferably more than or equal to 1 nm and less than or equal to 4 nm. Moreover, when the domain region includes the above-described multilayer structure, the thickness of the first layer means the average value of the respective thicknesses of the first layers at ten arbitrary locations in the multilayer structure. The same applies to the thickness of the second layer.

The total thickness of the thickness of the first layer and the thickness of the second layer (total of the respective thicknesses of one first layer and one second layer) is preferably more than or equal to 2 nm and less than or equal to 25 nm, is more preferably more than or equal to 2.5 nm and less than or equal to 25 nm, and is further preferably more than or equal to 5 nm and less than or equal to 20 nm.

x1 in the first AlTi compound is more than or equal to 0.89 and less than or equal to 0.97, and is preferably more than or equal to 0.9 and less than or equal to 0.95. x1 can be determined by using an energy dispersive X-ray spectroscopy (EDX) apparatus accompanied with a scanning electron microscope (SEM) or TEM to analyze crystal grains in the first layer appearing in the above-described cross sectional sample. Specifically, the values of x1 are measured and determined at arbitrary ten points in the first layer of the domain region of the cross sectional sample, and the average value of the determined values at the ten points is regarded as x1 in the first layer. Here, the "ten arbitrary points" are selected from different crystal grains in the first layer. Moreover, when the domain region includes the above-described multilayer structure, x1 means the average value of the respective values of x1 in the first layers at ten arbitrary locations in the multilayer structure. The same applies to below-described cases of x2, x3 and x4. Examples of the above-described EDX apparatus include JED-2300 (trademark) provided by JEOL Ltd.

x2 in the second AlTi compound is more than or equal to 0.5 and less than or equal to 0.61, and is preferably more than or equal to 0.52 and less than or equal to 0.58. x2 can be determined by using an EDX apparatus accompanied with a SEM or TEM to analyze crystal grains in the second layer appearing in the above-described cross sectional sample. Specifically, x2 is determined by the same method as the above-described method for determining x1.

The first AlTi compound included in the first layer includes a hexagonal crystal structure. The inclusion of the hexagonal crystal structure in the first AlTi compound can be confirmed by analyzing a pattern of an electron diffraction image obtained by performing selected area electron diffraction (SAED) measurement to the first layer of the cross sectional sample. Specifically, the electron diffraction measurement is performed to crystal grains of the first AlTi compound in the first layer. On this occasion, the number of crystal grains to be measured is at least more than or equal to 10 and is more preferably more than or equal to 20. Moreover, when the domain region includes the multilayer structure, for the electron diffraction measurement, the above-described method is preferably performed to the first layers at the arbitrary ten locations. The same applies to the second layer, the third layer, and the fourth layer, which are described below. Material crystal structure parameters required for the pattern analysis of the electron diffraction image are obtained from International Centre for Diffraction Data (ICDD), for example. The analysis can be performed using the crystal structure parameters and electron diffraction graphic simulation software (such as ReciPro). Examples of an apparatus used for the electron diffraction measurement includes "JEM-2100F" (trademark) provided by JEOL Ltd.

The second AlTi compound included in the second layer includes a cubic crystal structure. The inclusion of the cubic crystal structure in the second AlTi compound can be confirmed by performing electron diffraction measurement (SAED measurement) to the second layer of the cross sectional sample and performing a pattern analysis of the electron diffraction image. Specific conditions for the electron diffraction measurement and the pattern analysis of the electron diffraction image are the same as those described above.

In the present embodiment, the first AlTi compound includes the hexagonal crystal structure, and the second AlTi compound includes the cubic crystal structure. The first AlTi compound is preferably constituted of the hexagonal crystal structure, and the second AlTi compound is preferably constituted of the cubic crystal structure.

In one form of the present embodiment, the domain region preferably includes a twin crystal portion. Here, the "twin crystal portion" means a structure including a portion at which two single crystals of the domain region are gathered and joined in a certain direction. For example, region a shown in FIG. 2 corresponds to the twin crystal portion.

Whether the twin crystal portion is included or not can be determined by observing the domain region using a transmission electron microscope.

(Matrix Region)

In the present embodiment, the "matrix region" refers to a region (for example, region b in FIG. 1) serving as a matrix of the coating film and other than the domain region. In other words, it can be also understood that most portions of the matrix region are regions disposed to surround the plurality of regions included in the domain region. Moreover, it can be also understood that most portions of the matrix region are disposed between the plurality of regions of the domain region. The matrix region has a structure in which a third layer and a fourth layer are layered on each other, the third layer being composed of at least one third AlTi compound selected from a group consisting of $Al_{x3}Ti_{(1-x3)}N$, $Al_{x3}Ti_{(1-x3)}BN$, and $Al_{x3}Ti_{(1-x3)}CN$, the fourth layer being composed of at least one fourth AlTi compound selected from a group consisting of $Al_{x4}Ti_{(1-x4)}N$, $Al_{x4}Ti_{(1-x4)}BN$, and $Al_{x4}Ti_{(1-x4)}CN$. Here, x3 represents an atomic ratio of Al in the third layer and x4 represents an atomic ratio of Al in the fourth layer. The third AlTi compound is preferably an $Al_{x3}Ti_{(1-x3)}N$. Moreover, the fourth AlTi compound is preferably $Al_{x4}Ti_{(1-x4)}N$.

Figure 3:
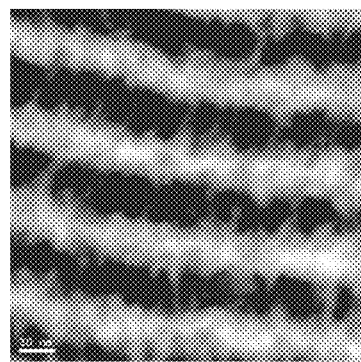
FIG. 3 shows an exemplary enlarged photograph of a region b.

FIG. 3 shows an exemplary enlarged photograph of region b. A multilayer structure may be formed in which one or more third layers (dark layers in FIG. 3) and one or more fourth layers (bright layers in FIG. 3) are layered alternately on each other. In the present embodiment, the matrix region may have a portion including such a multilayer structure. Alternatively, the matrix region may be constituted of such a multilayer structure.

The matrix region can be clearly distinguished from the above-described domain region by way of observation with a TEM and a selected area electron diffraction image analysis.

Although the volume ratio of the matrix region is not particularly limited, the volume ratio of the matrix region may be more than or equal to 10 volume % and less than or equal to 90 volume %, may be more than or equal to 20 volume % and less than or equal to 80 volume %, or may be more than or equal to 50 volume % and less than or equal to 80 volume % with respect to the total volume of the domain region and the matrix region. The volume ratio of the matrix region is determined by performing X-ray diffraction measurement (XRD measurement) and Rietveld analysis. Specifically, the volume ratio of the matrix region can be determined by the same method as the above-described method for determining the volume ratio of the domain region.

The thickness of the third layer is preferably more than or equal to 1 nm and less than or equal to 20 nm, and is more preferably more than or equal to 2.5 nm and less than or equal to 9.5 nm. The thickness of the fourth layer is preferably more than or equal to 0.5 nm and less than or equal to 10 nm, and is more preferably more than or equal to 1.5 nm and less than or equal to 5 nm. Moreover, when the matrix region includes the above-described multilayer structure, the thickness of the third layer means the average value of the respective thicknesses of the third layers at ten arbitrary locations in the multilayer structure. The same applies to the thickness of the fourth layer.

The total thickness of the thickness of the third layer and the thickness of the fourth layer (total of the respective thicknesses of one third layer and one fourth layer) is preferably more than or equal to 1.5 nm and less than or equal to 30 nm, and is more preferably more than or equal to 4 nm and less than or equal to 20 nm.

x3 in the third AlTi compound is more than or equal to 0.86 and less than or equal to 0.95, and is preferably more than or equal to 0.89 and less than or equal to 0.94. x3 can be determined by using an EDX apparatus accompanied with a SEM or TEM to analyze crystal grains in the third layer appearing in the above-described cross sectional sample. Specifically, x3 is determined by the same method as the method for determining x1.

x4 in the fourth AlTi compound is more than or equal to 0.5 and less than or equal to 0.65, and is preferably more than or equal to 0.53 and less than or equal to 0.61. x4 can be determined by using an EDX apparatus accompanied with a SEM or TEM to analyze crystal grains in the fourth layer appearing in the above-described cross sectional sample. Specifically, x4 is determined by the same method as the method for determining x1.

The third AlTi compound included in the third layer includes a hexagonal crystal structure. The inclusion of the hexagonal crystal structure in the third AlTi compound can be confirmed by performing electron diffraction measurement (SAED measurement) to the third layer of the cross sectional sample and performing a pattern analysis of the electron diffraction image. Specific conditions for the SAED measurement and the pattern analysis of the electron diffraction are the same as those described above.

The fourth AlTi compound included in the fourth layer includes a cubic crystal structure. The inclusion of the cubic crystal structure in the fourth AlTi compound can be confirmed by performing electron diffraction measurement (SAED measurement) to the fourth layer of the cross sectional sample and performing a pattern analysis of the electron diffraction. Specific conditions for the SAED measurement and the pattern analysis of the electron diffraction are the same as those described above.

In the present embodiment, the third AlTi compound includes the hexagonal crystal structure, and the fourth AlTi compound includes the cubic crystal structure. With this, the surface-coated cutting tool has an excellent thermal shock resistance. Preferably, the third AlTi compound is constituted of the hexagonal crystal structure, and the fourth AlTi compound is constituted of the cubic crystal structure.

(Other Layer(s))

As long as the effects of the present embodiment are not compromised, the coating film may further include other layer(s). The other layer(s) may each have a composition different from or the same as the composition of the hard coating layer. Examples of the other layer(s) include a TiN layer, a TiCN layer, a TiBN layer, an $Al_2O_3$ layer, and the like. It should be noted that an order of layering these layers is particularly not limited. Examples of the other layer(s) includes: a foundation layer provided between the substrate and the hard coating layer; an outermost layer provided on the hard coating layer; and the like. The thickness of each of the other layer(s) is not particularly limited as long as the effects of the present embodiment are not compromised. For example, the thickness of each of the other layer(s) is more than or equal to 0.1 μm and less than or equal to 2 μm.

<<Method for Manufacturing Surface-Coated Cutting Tool>>

A method for manufacturing a surface-coated cutting tool according to the present embodiment is a method for manufacturing a surface-coated cutting tool including a substrate and a coating film that coats the substrate, and includes preparing the substrate; and emitting first gas, second gas, and third gas to the substrate in an atmosphere at more than or equal to 650° C. and less than or equal to 900° C. and under more than or equal to 0.5 kPa and less than or equal to 5 kPa, the first gas including aluminum halide gas and titanium halide gas, the second gas including aluminum halide gas, titanium halide gas, and ammonia gas, the third gas including ammonia gas.

<Step of Preparing Substrate>

In this step, the substrate is prepared. As the substrate, any conventionally known substrate for such a purpose of use can be used as described above. For example, when the substrate is composed of cemented carbide, the substrate composed of cemented carbide can be obtained in the following manner: source material powders in a predetermined blending composition (mass %) are mixed uniformly using a commercially available attritor, and then the mixed powders are pressed and molded into a predetermined shape (for example, SEET13T3AGSN, CNMG120408, or the like) and are then sintered in a predetermined sintering furnace at 1300° C. to 1500° C. for 1 to 2 hours. Moreover, a commercially available product may be used for the substrate without modification. Examples of the commercially available product include EH520 (trademark) provided by Sumitomo Electric Industries HardMetal.

<Step of Emitting First Gas, Second Gas, and Third Gas to Substrate>

In this step, the first gas, the second gas, and the third gas are emitted to the substrate in an atmosphere at more than or equal to 650° C. and less than or equal to 900° C. and under more than or equal to 0.5 kPa and less than or equal to 5 kPa, the first gas including aluminum halide gas and titanium halide gas, the second gas including aluminum halide gas, titanium halide gas, and ammonia gas, the third gas including ammonia gas. This step can be performed using a CVD apparatus described below, for example.

(CVD Apparatus)

Figure 4:
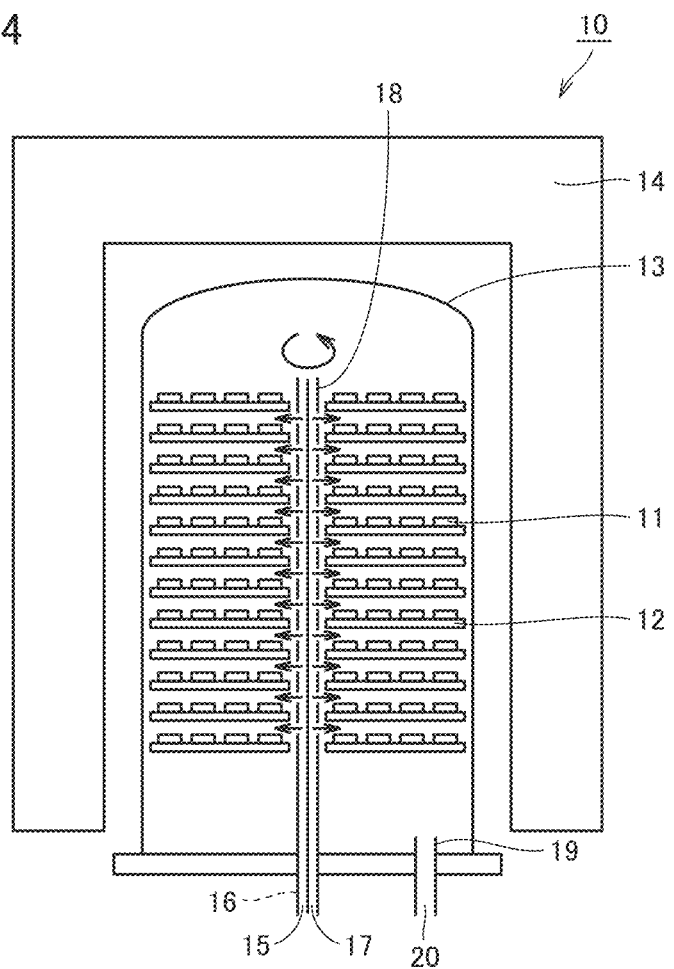
FIG. 4 is a schematic cross sectional view of a CVD apparatus used to manufacture the surface-coated cutting tool according to the present embodiment.
Figure 5:
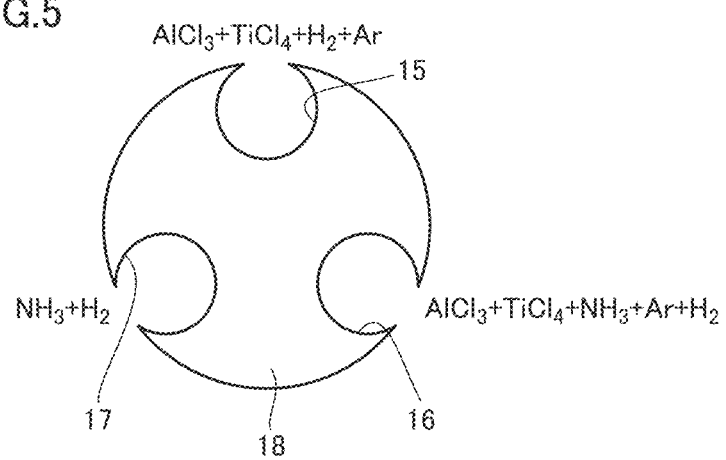
FIG. 5 is a schematic cross sectional view of a gas inlet pipe of the CVD apparatus used to manufacture the surface-coated cutting tool according to the present embodiment.

FIG. 4 is a schematic cross sectional view of an exemplary CVD apparatus used to manufacture the cutting tool according to the embodiment. As shown in FIG. 4, CVD apparatus 10 includes: a plurality of substrate setting jigs 12 for placing substrates 11; and a reaction container 13 that is composed of a heat-resistant alloy steel and that covers substrate setting jigs 12. Moreover, a temperature adjusting apparatus 14 for controlling a temperature in reaction container 13 is provided to surround reaction container 13.

In reaction container 13, a gas inlet pipe 18 is provided to extend in an inner space of reaction container 13 in the vertical direction and to be rotatable with respect to its axis in the vertical direction Gas inlet pipe 18 has a first gas inlet pipe 15, a second gas inlet pipe 16, and a third gas inlet pipe 17, which are adjacent to and joined to one another. Gas inlet pipe 18 is configured to avoid the first gas introduced into first gas inlet pipe 15, the second gas introduced into second gas inlet pipe 16, and the third gas introduced into third gas inlet pipe 17 from being mixed with one another in gas inlet pipe 18. Moreover, first gas inlet pipe 15, second gas inlet pipe 16, and third gas inlet pipe 17 have respective portions provided with a plurality of through holes for emitting, to substrates 11 placed on substrate setting jigs 12, the gases flowing in first gas inlet pipe 15, second gas inlet pipe 16, and third gas inlet pipe 17.

Further, reaction container 13 is provided with a gas exhaust pipe 19 for exhausting the gas inside reaction container 13 to outside. The gas inside reaction container 13 passes through gas exhaust pipe 19 and is exhausted to the outside of reaction container 13 via a gas outlet 20.

More specifically, the first gas, the second gas, and the third gas are introduced into first gas inlet pipe 15, second gas inlet pipe 16, and third gas inlet pipe 17, respectively. On this occasion, the temperatures of the first gas, the second gas, and the third gas in the respective gas inlet pipes are not particularly limited as long as the first gas, the second gas, and the third gas are not liquefied at these temperatures. Next, the first gas, the second gas, and the third gas are repeatedly emitted in this order into reaction container 13 having an atmosphere at more than or equal to 650° C. and less than or equal to 900° C. (preferably, more than or equal to 750° C. and less than or equal to 770° C.) and under more than or equal to 0.5 kPa and less than or equal to 5 kPa (preferably, more than or equal to 2.5 kPa and less than or equal to 3 kPa). Since the plurality of through holes are provided in gas inlet pipe 18, the introduced first gas, second gas, and third gas are emitted from different through holes into reaction container 13. On this occasion, gas inlet pipe 18 is rotated at a rotating speed of, for example, 2 to 4 rpm with respect to its axis as indicated by a rotation arrow in FIG. 4. Accordingly, the first gas, the second gas, and the third gas can be repeatedly emitted to substrate 11 in this order.

(First Gas)

The first gas includes aluminum halide gas and titanium halide gas Examples of the aluminum halide gas include aluminum chloride gas ($AlCl_3$ gas or $Al_2Cl_6$ gas), and the like. Preferably, $AlCl_3$ gas is used. The concentration (volume %) of the aluminum halide gas is preferably more than or equal to 1 volume % and less than or equal to 5 volume % and is more preferably more than or equal to 2.1 volume % and less than or equal to 2.4 volume % relative to the total volume of the first gas.

Examples of the titanium halide gas include titanium(V) chloride gas ($TiCl_4$ gas), titanium(III) chloride gas ($TiCl_3$ gas), and the like. Preferably, titanium(IV) chloride gas is used. The concentration (volume %) of the titanium halide gas is preferably more than or equal to 0.05 volume % and less than or equal to 1 volume % and is more preferably more than or equal to 0.1 volume % and less than or equal to 0.4 volume % relative to the total volume of the first gas.

A molar ratio of the aluminum halide gas in the first gas is preferably more than or equal to 0.8 and less than or equal to 0.98 and is more preferably more than or equal to 0.85 and less than or equal to 0.95 relative to the total number of moles of the aluminum halide gas and the titanium halide gas. The present inventors consider that when the molar ratio falls within the above-described range, the third layer and the fourth layer are formed through nucleation-growth decomposition.

The first gas may include hydrogen gas, or may include an inert gas such as argon gas. The concentration (volume %) of the inert gas is preferably more than or equal to 5 volume % and less than or equal to 50 volume % and is more preferably more than or equal to 20 volume % and less than or equal to 40 volume % relative to the total volume of the first gas. The hydrogen gas is normally a remainder of the first gas.

The first gas is preferably emitted to the substrate at a flow rate of 20 to 30 L/min.

(Second Gas)

The second gas includes aluminum halide gas, titanium halide gas, and ammonia gas. For the aluminum halide gas and the titanium halide gas, gases illustrated in the above section "(First Gas)" can be used. On this occasion, the aluminum halide gas and the titanium halide gas used for the first gas may be the same as or different from the aluminum halide gas and the titanium halide gas used for the second gas, respectively.

The concentration (volume %) of the aluminum halide gas is preferably more than or equal to 4 volume % and less than or equal to 5 volume % and is more preferably more than or equal to 4.3 volume % and less than or equal to 4.8 volume % relative to the total volume of the second gas.

The concentration (volume %) of the titanium halide gas is preferably more than or equal to 0.1 volume % and less than or equal to 1 volume % and is more preferably more than or equal to 0.3 volume % and less than or equal to 0.8 volume % relative to the total volume of the second gas.

A molar ratio of the aluminum halide gas in the second gas is preferably more than or equal to 0.82 and less than or equal to 0.98 and is more preferably more than or equal to 0.85 and less than or equal to 0.95 relative to the total number of moles of the aluminum halide gas and the titanium halide gas. The present inventors consider that when the molar ratio falls within the above-described range, the first layer and the second layer are formed through nucleation-growth decomposition.

The concentration (volume %) of the ammonia gas is preferably more than or equal to 5 volume % and less than or equal to 25 volume % and is more preferably more than or equal to 10 volume % and less than or equal to 20 volume % relative to the total volume of the second gas.

The second gas may include hydrogen gas, or may include an inert gas such as argon gas. The concentration (volume/o) of the inert gas is preferably more than or equal to 5 volume % and less than or equal to 50 volume % and is more preferably more than or equal to 15 volume % and less than or equal to 20 volume/o relative to the total volume of the second gas. The hydrogen gas is normally a remainder of the second gas.

The second gas is preferably emitted to the substrate at a flow rate of 30 to 40 L/min.

(Third Gas)

The third gas includes ammonia gas. Moreover, the third gas may include hydrogen gas, or may include an inert gas such as argon gas. By emitting the third gas to the substrate, the formation of the matrix region is promoted.

The concentration (volume %) of the ammonia gas is preferably more than or equal to 3 volume % and less than or equal to 30 volume % and is more preferably more than or equal to 10 volume % and less than or equal to 20 volume % relative to the total volume of the third gas. The hydrogen gas is normally a remainder of the third gas.

The third gas is preferably emitted to the substrate at a flow rate of 10 to 20 L/min.

<Other Step(s)>

In the manufacturing method according to the present embodiment, in addition to the steps described above, a step of forming the other layer(s), a step of performing surface treatment, and/or the like may be performed appropriately. When the above-described other layer(s) are formed, the other layer(s) may be formed by a conventional method.

EXAMPLES

While the present invention will be described in detail hereinafter with reference to Examples, the present invention is not limited thereto.

<<Production of Cutting Tool>>
<Preparation of Substrate>

First, as substrates on which coating films were to be formed, substrates K and substrates L shown in Table 1 below were prepared (the step of preparing the substrate). Specifically, first, source material powders in a blending composition (mass %) described in Table 1 were mixed uniformly. The expression "Remainder" in Table 1 indicates that WC or c-BN is a remainder of the blending composition (mass %).

TABLE 1

| | | Blending Composition (Mass %) | | | | |
|---|---|---|---|---|---|---|
| Type | | Co | TiCN | TaC | c-BN | WC |
| Substrate | K | None | 40 | None | Remainder | None |
| | L | 10.0 | None | 2.0 | None | Remainder |

Next, the mixed powders were pressed and molded into a predetermined shape and were then sintered at 1300 to 1500° C. for 1 to 2 hours, thereby obtaining substrates K each composed of c-BN composite sintered material (substrate shape (JIS): 4NC-CNGA120408) and substrates L each composed of cemented carbide (substrate shape (JIS): SEET13T3AGSN-L).

It should be noted that 4NC-CNGA120408 represents a shape of an indexable cutting insert for turning, and SEET13T3AGSN-L represents a shape of an indexable cutting insert for milling.

<Production of Coating Film>

By forming the foundation layer, the hard coating layer, and the outermost layer shown in Table 11 on a surface of substrate K or substrate L, a coating film was produced on the surface of substrate K or substrate L. The following describes a method for producing each layer included in the coating film.

(Production of Hard Coating Layer)

Under film formation conditions described in Table 2, first gas, second gas, and third gas, which have compositions described in Tables 3 to 5, were repeatedly emitted to the surface of each substrate K or L in this order, thereby producing a hard coating layer (the step of emitting the first gas, the second gas, and the third gas to the substrate). It should be noted that when the foundation layer was provided on the surface of the substrate, the hard coating film was provided on a surface of the foundation layer.

For example, a hard coating layer indicated by an identification sign [1] of Table 6 was produced by repeatedly emitting the first gas, the second gas and the third gas to the surface of the substrate in this order under film formation conditions (identification sign A of Table 2) involving a temperature of 750° C., a pressure of 2.5 kPa, and a gas inlet pipe rotating speed of 2 rpm, the first gas being indicated by an identification sign 1-b in Table 3 (2.3 volume % of $AlCl_3$, 0.3 volume % of $TiCl_4$, 20 volume % of Ar, and a remainder of $H_2$; gas flow rate of 20 L/min), the second gas being indicated by an identification sign 2-b in Table 4 (4.5 volume % of $AlCl_3$, 0.5 volume % of $TiCl_4$, 10 volume % of $NH_3$, 17 volume % of Ar and a remainder of $H_2$; gas flow rate of 40 L/min), the third gas being indicated by an identification sign 3-a in Table 5 (10 volume % of $NH_3$ and a remainder of $H_2$; gas flow rate of 10 L/min). The composition and the like of the produced hard coating layer are shown in Table 6. The expression "None" in Table 6 indicates that since a corresponding gas was not emitted, no domain region or no matrix region was formed.

TABLE 2

| | Film Formation Conditions | | |
|---|---|---|---|
| Identification Sign | A | B | C |
| Temperature (° C.) | 750 | 770 | 770 |
| Pressure (kPa) | 2.5 | 3.0 | 3.0 |
| Rotating Speed (rpm) | 2 | 2 | 4 |

TABLE 3

| | Composition of First Gas | | | | |
|---|---|---|---|---|---|
| Identification Sign | 1-a | 1-b | 1-c | 1-d | 1-e |
| $AlCl_3$ (vol %) | 2.1 | 2.3 | 2.4 | 2.1 | 0.5 |
| $TiCl_4$ (vol %) | 0.4 | 0.3 | 0.1 | 0.4 | 0.5 |
| $AlCl_3/(AlCl_3 + TiCl_4)$ (Molar Ratio) | 0.85 | 0.90 | 0.95 | 0.85 | 0.5 |
| Ar (vol %) | 30 | 20 | 40 | 30 | 30 |
| $H_2$ (vol %) | Remainder | Remainder | Remainder | Remainder | Remainder |
| Gas Flow Rate (L/min) | 20 | 20 | 20 | 30 | 30 |

TABLE 4

| | Composition of Second Gas | | | | |
|---|---|---|---|---|---|
| Identification Sign | 2-a | 2-b | 2-c | 2-d | 2-e |
| $AlCl_3$ (vol %) | 4.3 | 4.5 | 4.8 | 4.3 | 2.0 |
| $TiCl_4$ (vol %) | 0.8 | 0.5 | 0.3 | 0.8 | 2.0 |
| $AlCl_3/(AlCl_3 + TiCl_4)$ (Molar Ratio) | 0.85 | 0.90 | 095 | 0.85 | 0.5 |
| $NH_3$ (vol %) | 10 | 10 | 10 | 10 | 10 |
| Ar (vol %) | 15 | 17 | 20 | 15 | 15 |
| $H_2$ (vol %) | Remainder | Remainder | Remainder | Remainder | Remainder |
| Gas Flow Rate (L/min) | 40 | 40 | 40 | 30 | 30 |

TABLE 5

| | Composition of Third Gas | |
|---|---|---|
| Identification Sign | 3-a | 3-b |
| $NH_3$ (vol %) | 10 | 20 |
| $H_2$ (vol %) | Remainder | Remainder |
| Gas Flow Rate (L/min) | 10 | 10 |

TABLE 6

| | | | | | Domain Region | | | | |
|---|---|---|---|---|---|---|---|---|---|
| | | | | | First Layer h-AlTiN | | Second Layer c-TiAlN | | Total |
| Identification Sign | Table 2 | Table 3 | Table 4 | Table 5 | Thickness (nm) | Composition of Al x1 | Thickness (nm) | Composition of Al x2 | Thickness (nm) |
| [1] | A | 1-b | 2-b | 3-a | 11.0 | 0.93 | 1.8 | 0.51 | 12.8 |
| [2] | B | 1-b | 2-b | 3-a | 9.0 | 0.92 | 1.6 | 0.54 | 10.6 |
| [3] | C | 1-b | 2-b | 3-a | 12.0 | 0.93 | 2.0 | 0.59 | 14.0 |
| [4] | A | 1-b | 2-b | 3-b | 13.0 | 0.90 | 2.5 | 0.50 | 15.5 |
| [5] | C | 1-a | 2-a | 3-b | 13.0 | 0.90 | 2.0 | 0.56 | 15.0 |
| [6] | B | 1-a | 2-c | 3-a | 8.0 | 0.95 | 1.5 | 0.61 | 9.5 |
| [7] | B | 1-c | 2-a | 3-a | 7.5 | 0.89 | 1.5 | 0.56 | 9.0 |
| [8] | B | 1-c | 2-a | 3-b | 10.0 | 0.91 | 2.0 | 0.53 | 12.0 |
| [9] | A | 1-c | 2-c | 3-b | 15.0 | 0.97 | 3.0 | 0.61 | 18.0 |
| [10] | A | 1-d | 2-d | 3-a | 6.5 | 0.89 | 1.2 | 0.58 | 7.7 |
| [y] | A | 1-b | None | 3-a | | | None | | |

TABLE 6-continued

| [z] | A | None | 2-b | None | 11.0 | 0.90 | 1.5 | 0.50 | 12.5 |
| [α] | A | 1-e | 2-e | 3-b | 6.0 | 0.73 | 2.4 | 0.46 | 8.4 |

| | Matrix Region | | | | | | |
|---|---|---|---|---|---|---|---|
| | Third Layer h-AlTiN | | Fourth Layer c-TiAlN | | Total | Film | Film Young's |
| Identification Sign | Thickness (nm) | Composition of Al x3 | Thickness (nm) | Composition of Al x4 | Thickness (nm) | Hardness (GPa) | Modulus (GPa) |
| [1] | 4.4 | 0.89 | 2.1 | 0.61 | 6.5 | 31 | 484 |
| [2] | 3.7 | 0.95 | 1.7 | 0.65 | 5.4 | 32 | 500 |
| [3] | 4.2 | 0.90 | 1.6 | 0.50 | 5.8 | 31 | 477 |
| [4] | 5.5 | 0 86 | 2.5 | 0 57 | 8.0 | 31 | 484 |
| [5] | 5.2 | 0 86 | 2.4 | 0 58 | 7.6 | 31 | 479 |
| [6] | 3.3 | 0.90 | 1.8 | 0.60 | 5.1 | 33 | 516 |
| [7] | 5.3 | 0.94 | 2.2 | 0.61 | 7.5 | 33 | 516 |
| [8] | 7.9 | 0.90 | 3.1 | 0.57 | 11.0 | 31 | 449 |
| [9] | 11.3 | 0.95 | 4.5 | 0.53 | 15.8 | 30 | 469 |
| [10] | 3.5 | 0.92 | 1.8 | 0.58 | 5.3 | 29 | 446 |
| [y] | 3.8 | 0.89 | 2.1 | 0.56 | 5.9 | 25 | 391 |
| [z] | | | None | | | 30 | 625 |
| [α] | 3.3 | 0.68 | 1.3 | 0.45 | 4.6 | 34 | 596 |

(Production of Foundation Layer and Production of Outermost Layer)

Under film formation conditions described in Table 7, reactive gas having a composition described in Table 7 was emitted to the surface of the substrate in the case of the foundation layer and was emitted to the surface of the hard coating layer in the case of the outermost layer, thereby producing the foundation layer and the outermost layer.

TABLE 7

| Type of Foundation Layer or Outermost Layer | Composition of Reactive Gas (vol %) | Film Formation Conditions | | |
|---|---|---|---|---|
| | | Pressure (kPa) | Temperature (° C.) | Gas Flow Rate (L/min) |
| TiN (Foundation Layer) | $TiCl_4$ = 2.0%, $N_2$ = 39.7%, $H_2$ = Remainder | 6.7 | 915 | 63.8 |
| TiN (Outermost Layer) | $TiCl_4$ = 0.5%, $N_2$ = 41.2%, $H_2$ = Remainder | 79.8 | 780 | 45.9 |
| TiCN | $TiCl_4$ = 2.0%, $CH_3CN$ = 0.7%, $H_2$ = Remainder | 9 | 860 | 50.5 |
| TiBN | $TiCl_4$ = 36.7%, $BCl_3$ = 0.1%, $N_2$ = 61.7%, $H_2$ = Remainder | 6.7 | 800 | 80.3 |
| $Al_2O_3$ | $AlCl_3$ = 1.6%, $CO_2$ = 4.5%, $H_2S$ = 0.2%, $NO_2$ = 0.5%, $H_2$ = Remainder | 6.7 | 850 | 46.2 |

<<Evaluation on Characteristics of Cutting Tool>>

By using cutting tools of the samples (Examples 1 to 20 and Comparative Examples 1 to 6) produced as described above, characteristics of each of the cutting tools were evaluated as described below.

<Measurement of Thicknesses of Coating Film and the Like>

The thickness of the coating film as well as the respective thicknesses of the foundation layer, the hard coating layer (the first layer, the second layer, the third layer, and the fourth layer), and the outermost layer included in the coating film were determined by using a transmission electron microscope (TEM) (trademark: JEM-2100F provided by JEOL Ltd.) to perform measurement at arbitrary ten points in a cross sectional sample parallel to the normal direction of the surface of the substrate and calculating the average value of the measured thicknesses at the ten points. Results are shown in Table 6 and Table 11. Here, the expression "Thickness" of the first layer in Table 6 means the average value of the respective thicknesses of the plurality of first layers included in the multilayer structure, the thicknesses of the plurality of first layers being determined by the above-described method. The same applies to the thicknesses of the second layer, the third layer, and the fourth layer. In Table 11, the expression "Same as Above" in the sections "Foundation Layer" and "Outermost Layer" indicates that the composition and thickness of the foundation layer or the outermost layer are the same as those of the foundation layer or the outermost layer in Examples described above. Moreover, the expression "None" in the section "Outermost Layer" indicates that the outermost layer does not exist in the coating film. Moreover, the expression "[1] (7.0)" or the like in the section "Hard Coating Layer" indicates that the hard coating layer has the configuration indicated by the identification sign [1] of Table 6 and has a thickness of 7.0 μm. The expression "TiN(1.0)" or the like in Table 11 indicates that the corresponding layer is a TiN layer having a thickness of 1.0 μm. Moreover, when two compounds are described in one section (for example, "TiN(0.5)-TiCN (2.5)" or the like), it is indicated that the compound (TiN (0.5)) at the left side is a layer located at a side close to the surface of the substrate and the compound (TiCN(2.5)) at the right side is a layer located at a side far from the surface of the substrate. Further, the expression "[$Al_2O(0.2)$-TiN(0.1)]

x3" or the like means that three layers each represented by "Al$_2$O$_3$(0.2)-TiN(0.1)" are repeatedly layered. It should be noted that the order of layering the Al$_2$O$_3$ layer and the TiN layer in the "Al$_2$O$_3$(0.2)-TiN(0.1)" is the same as that in the above description.

Moreover, as a result of observation of the hard coating layer using a TEM, it was found that the domain region had a multilayer structure in which the first layer and the second layer were layered alternately (for example, FIG. 2). Moreover, a twin crystal portion was observed in the domain region. Further, from a selected area electron diffraction image, it was found that the first layer and the second layer of the domain region respectively had a hexagonal crystal structure and a cubic crystal structure, and the Al composition in the first layer and the Al composition in the second layer were different in a <100> direction. On the other hand, it was found that in the matrix region, a multilayer structure was formed in which the third layer and the fourth layer were layered alternately (for example, FIG. 3).

<Measurement of Film Hardness and Film Young's Modulus>

The film hardness and film Young's modulus of the hard coating layer were measured under below-described conditions using a nano indenter (trademark: ENT1100a provided by Elionix). On this occasion, when measuring them in a sample in which the hard coating layer is not located on the outermost surface, the measurement was performed after the hard coating layer was exposed by mechanical polishing or the like. Moreover, the film hardnesses were measured and determined at arbitrary ten points in the hard coating layer, and the average value of the determined film hardnesses at the ten points were employed as the film hardness and the film Young's modulus in the hard coating layer. It should be noted that the film hardness and film Young's modulus of the hard coating layer was calculated from a curve of load and displacement based on the Oliver-Pharr theory. Results are shown in Table 6.

Measurement Conditions of Nano Indenter
Indenter material: Diamond
Indenter shape: Berkovich indenter
Test load: 30 mN
Step interval: 20 msec
Holding time: 1000 msec
The number of measurement points: 10 points <Crystal Structures of Domain Region and Matrix Region>

The AlTiN crystal structures in the domain region (the first layer and the second layer) and the matrix region (the third layer and the fourth layer) were measured under conditions shown in Table 8 below by using a transmission electron microscope and an apparatus (trademark: JEM-2100F provided by JEOL Ltd.) for selected area electron diffraction measurement (TEM-SAED measurement). On this occasion, the number of crystal grains to be measured was at least 10 or more in a layer at one location. The measurement was performed for each of layers at ten arbitrary locations. As a result, it was found that each of the second layer of the domain region and the fourth layer of the matrix region had a cubic crystal structure. Moreover, it was found that each of the first layer of the domain region and the third layer of the matrix region had a hexagonal crystal structure. It should be noted that in the sections "Domain Region" and "Matrix Region" of Table 6, "h" in the expression "h-AlTiN" or the like indicates that the compound has a hexagonal crystal structure. Moreover, "c" in the expression "c-AlTiN" or the like indicates that the compound has a cubic crystal structure.

TABLE 8

| TEM Observation and Electron Diffraction Analysis Method | |
|---|---|
| Apparatus | JEM-2100F (Provided by JEOL Ltd.) |
| Acceleration Voltage | 200 kV |
| Amount of Current | 80 pA |
| Camera Length | 1 m |
| Size of Selected Area | φ200 nm |
| Observation Magnification | 5000x to 1500000x |

<Compositions of Domain Region and Matrix Region>

The respective compositions of the first layer, second layer, third layer, and fourth layer in the hard coating layer were measured under conditions of Table 9 below by using an EDX measurement apparatus (trademark: JED-2300 provided by JEOL Ltd.). For example, the values of x1 were determined by performing measurement at arbitrary ten points in the first layer of the domain region of the cross sectional sample, and the average value of the determined values at the ten points was regarded as x1 in the first layer. Here, the "ten arbitrary points" were selected from different crystal grains in the first layer. Moreover, when the domain region includes the above-described multilayer structure, x1 was represented by the average value of the respective values of x1 of the first layers at ten arbitrary locations in the multilayer structure. The same method was employed for the second layer, the third layer, and the fourth layer. Results are shown in Table 6.

EDX Measurement Conditions

TABLE 9

| EDX Analysis Method | |
|---|---|
| Apparatus | JED-2300 (Provided by JEOL Ltd.) |
| Detector | Silicon Drift Detector |
| Analysis Software | Analysis station (Provided by JEOL Ltd.) |
| Analysis Spot Size | 0.1 nm |

<Volume Ratios of Domain Region and Matrix Region>

The respective volume ratios of the domain region and the matrix region were measured under conditions shown in Table 10 below with respect to the total volume of the domain region (the first layer and the second layer) and the matrix region (the third layer and the fourth layer) by using an X-ray diffraction measurement (XRD measurement) apparatus (trademark: SmartLab provided by Rigaku). On this occasion, when measuring them in a sample in which the hard coating layer is not located on the outermost surface, the measurement was performed after the hard coating layer was exposed by mechanical polishing or the like. Moreover, each of regions to be measured was a flat region within 2 mm from the cutting edge of the tool. Two regions to be measured were selected and measurement was performed twice or more for each region. As a result, it was found that each of the second layer of the domain region and the fourth layer of the matrix region had a cubic crystal structure. It was found that each of the first layer of the domain region and the third layer of the matrix region had a hexagonal crystal structure. Moreover, the respective volume ratios of the domain region and the matrix region could be quantitatively estimated by way of the Rietveld analysis (analysis software name: PDXL provided by Rigaku). Specifically, in the hard coating layer corresponding to each of identification signs [1] to [9] in Table 6, the volume ratios of the domain region and the matrix region were 80 volume % and 20 volume %, respectively. Moreover, in the hard coating layer corresponding to the identification sign [10] in Table 6, the volume ratios of the domain region and the matrix region were 50 volume % and 50 volume %, respectively.

TABLE 10

| | XRD Measurement and Analysis Method | |
|---|---|---|
| Apparatus | SmartLab (provided by Rigaku) | |
| X-ray Output | 9 kW (Voltage 40 kV, Current: 200 mA) | |
| X-ray Target | Cu | |
| X-ray Optical System | Concentrated Optical System | |
| | Incoming X-ray Parallel Slit | Soller_slit_5 deg |
| | Incoming Slit | ⅔ deg |
| | Longitudinally Limited Slit | 2 mm |
| | Light Receiving Slit 1 | 20 mm |
| | Filter | Ni |
| | Light Receiving Parallel Slit | Soller_slit_5 deg |
| | Light Receiving Slit 2 | 20 mm |
| | Detector | Silicon Strip Detector (D/teX Ultra 250 (provided by Rigaku) |
| Measurement Conditions | Scanning Range (2θ) | 30 to 90 deg |
| | Scanning Rate | 1 deg/min |
| Data Analysis | Analysis Software | PDXL Rietveld Analysis (provided by Rigaku) |
| | Material Crystal Structure Parameters Required for Data Analysis | Obtained from international Centre for Diffraction Data (ICDD) |

TABLE 11

| | | Configuration of Coating Film and Thickness of Each Layer | | | |
|---|---|---|---|---|---|
| Sample Number | Substrate Type | Foundation Layer (μm) | Hard Coating Layer (μm) | Outermost Layer (μm) | Total Thickness of Coating Film (μm) |
| Example 1 | K | TiN(0.5) | [1] (7.0) | None | 7.5 |
| Example 2 | K | Same as Above | [2] (6.0) | Al$_2$O$_3$ (1.0) | 7.5 |
| Example 3 | K | Same as Above | [3] (6.0) | [Al$_2$O$_3$(0.2)—TiN(0.1)] × 3 | 7.4 |
| Example 4 | K | TiN(0.5)—TiCN(2.5) | [4] (6.0) | None | 9.0 |
| Example 5 | K | Same as Above | [5] (5.5) | None | 8.5 |
| Example 6 | K. | TiN(1.0) | [6] (10.5) | None | 11.5 |
| Example 7 | K | Same as Above | [7] (10.0) | Al$_2$O$_3$ (1.0) | 12.0 |
| Example 8 | K | Same as Above | [8] (10.0) | [Al$_2$O$_3$(0.2)—TiN(0.1)] × 3 | 11.9 |
| Example 9 | K | Same as Above | [9] (15.0) | None | 16.0 |
| Example 10 | K | Same as Above | [10] (8.0) | None | 9.0 |
| Example 11 | L | TiN(1.0) | [1] (10.0) | TiN (1.0) | 12.0 |
| Example 12 | L | Same as Above | [2] (10.0) | Same as Above | 12.0 |
| Example 13 | L | Same as Above | [3] (9.0) | Same as Above | 11.0 |
| Example 14 | L | Same as Above | [4] (8.0) | Al$_2$O$_3$ (1.0) | 10.0 |
| Example 15 | L | TiN(0.5) | [5] (10.0) | None | 10.5 |
| Example 16 | L | Same as Above | [6] (10.8) | None | 11.3 |
| Example 17 | L | Same as Above | [7] (10.5) | TiBN (0.5) | 11.5 |
| Example 18 | L | Same as Above | [8] (10) | None | 10.5 |
| Example 19 | L | Same as Above | [9] (8) | [Al$_2$O$_3$(0.2)—TiN(0.1)] × 3 | 9.4 |
| Example 20 | L | Same as Above | [10] (8.0) | None | 8.5 |
| Comparative Example 1 | K | TiN(0.5) | [y] (7.0) | None | 7.5 |
| Comparative Example 2 | K | TiN(0.5)—TiCN(2 5) | [z] (6.0) | None | 9.0 |
| Comparative Example 3 | L | TiN(1.0) | [y] (10.0) | TiN (1.0) | 12.0 |
| Comparative Example 4 | L | TiN(0.5) | [z] (10.0) | None | 10.5 |
| Comparative Example 5 | K | TiN(0.5) | [α] (5.0) | None | 5.5 |
| Comparative Example 6 | L | TiN(1.0) | [α] (5.0) | None | 6.0 |

<<Cutting Test>>

<Test 1: Turning Test>

Each of the cutting tools of the samples (Examples 1 to 10 and Comparative Examples 1, 2, and 5) produced as described above was used to measure a cutting time until a flank face wear amount (Vb) reached 0.2 mm or breakage (chipping) occurred under below-described cutting conditions. Moreover, a type of final damage of the cutting edge thereof was observed. Results are shown in Table 12. As the cutting time is longer, the cutting tool can be evaluated to have more excellent wear resistance Cutting Conditions Workpiece: SUJ2

Circumferential speed: 400 m/min

Amount of cut (ap): 1.5 mm

Cutting environment: dry type

TABLE 12

| Sample Number | Cutting Time (Minute) | Type of Final Damage |
|---|---|---|
| Example 1 | 23 | Normal Wear |
| Example 2 | 24 | Normal Wear |
| Example 3 | 22 | Normal Wear |
| Example 4 | 28 | Normal Wear |
| Example 5 | 25 | Normal Wear |
| Example 6 | 30 | Normal Wear |
| Example 7 | 35 | Normal Wear |
| Example 8 | 30 | Normal Wear |
| Example 9 | 15 | Normal Wear |
| Example 10 | 15 | Normal Wear |
| Comparative Example 1 | 7 | Chipping |
| Comparative Example 2 | 13 | Chipping |
| Comparative Example 5 | 10 | Chipping |

<Test 2: Milling Test>

Each of the cutting tools of the samples (Examples 11 to 20 and Comparative Examples 3, 4, and 6) produced as described above was used to measure a cutting time until a flank face wear amount (Vb) reached 0.2 mm or breakage (chipping) occurred under below-described cutting conditions. Moreover, a type of final damage of the cutting edge thereof was observed. Results are shown in Table 13. As the cutting time is longer, the cutting tool can be evaluated to have more excellent wear resistance.

Cutting Conditions
Workpiece: SUS316L
Circumferential speed: 250 m/min
Amount of cut (ap): 2 mm
Width of cut (ae): 30 mm
Cutting environment, wet type

TABLE 13

| Sample Number | Cutting Time (Minute) | Type of Final Damage |
|---|---|---|
| Example 11 | 25 | Normal Wear |
| Example 12 | 26 | Normal Wear |
| Example 13 | 22 | Normal Wear |
| Example 14 | 21 | Normal Wear |
| Example 15 | 22 | Normal Wear |
| Example 16 | 25 | Normal Wear |
| Example 17 | 25 | Normal Wear |
| Example 18 | 22 | Normal Wear |
| Example 19 | 19 | Normal Wear |
| Example 20 | 18 | Normal Wear |
| Comparative Example 3 | 10 | Chipping |
| Comparative Example 4 | 15 | Normal Wear |
| Comparative Example 6 | 5 | Breakage |

In view of the results of Table 12, each of the cutting tools of Examples 1 to 10 attained excellent results, i.e., the cutting time was more than or equal to 15 minutes. Moreover, the type of final damage of each of the cutting tools of Examples 1 to 10 was normal wear. On the other hand, the cutting times of the cutting tools of Comparative Examples 1, 2, and 5 were 7 minutes, 13 minutes, and 10 minutes, respectively. Moreover, chipping was observed in each of the cutting tools of Comparative Example 1, Comparative Example 2, and Comparative Example 5. Since it is presumed that cutting resistance is high in the cutting conditions of Test 1, it is considered that each of the cutting tools of Examples 1 to 10 has improved strength at a high temperature and excellent thermal shock resistance as compared with the cutting tools of Comparative Examples 1, 2, and 5. That is, it was found that the cutting tools of Examples 1 to 10 were excellent in breakage resistance, wear resistance and thermal shock resistance.

In view of the results of Table 13, each of the cutting tools of Examples 11 to 20 attained excellent results, i.e., the cutting time was more than or equal to 18 minutes. Moreover, the type of final damage of each of the cutting tools of Examples 11 to 20 was normal wear. On the other hand, the cutting times of the cutting tools of Comparative Examples 3, 4, and 6 were 10 minutes, 15 minutes, and 5 minutes, respectively. Moreover, chipping was observed in the cutting tool of Comparative Example 3. Breakage was observed in the cutting tool of Comparative Example 6. In view of the results of Test 2, it was found that each of the cutting tools of Examples 11 to 20 had more excellent breakage resistance and wear resistance as well as a longer tool life than those of the cutting tools of Comparative Examples 3, 4, and 6. Moreover, it was found that each of the cutting tools of Examples 11 to 20 is suitable for wet type intermittent machining as compared with each of the cutting tools of Comparative Examples 3, 4, and 6.

Heretofore, the embodiments and examples of the present invention have been illustrated, but it has been initially expected to appropriately combine configurations of the embodiments and examples.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST

10: CVD apparatus; 11: substrate; 12: substrate setting jig; 13: reaction container; 14: temperature adjusting apparatus; 15: first gas inlet pipe; 16: second gas inlet pipe; 17: third gas inlet pipe; 18: gas inlet pipe; 19: gas exhaust pipe; 20: gas outlet; a: region a, domain region; b: region b, matrix region.

The invention claimed is:

1. A surface-coated cutting tool comprising a substrate and a coating film that coats the substrate, wherein
the coating film includes a hard coating layer constituted of a domain region and a matrix region,
the domain region is a region having a plurality of portions divided and distributed in the matrix region,
the domain region has a structure in which a first layer and a second layer are layered on each other, the first layer being composed of at least one first AlTi compound selected from a group consisting of $Al_{x1}Ti_{(1-x1)}N$, $Al_{x1}Ti_{(1-x1)}BN$, and $Al_{x1}Ti_{(1-x1)}CN$, the second layer being composed of at least one second AlTi compound selected from a group consisting of $Al_{x2}Ti_{(1-x2)}N$, $Al_{x2}Ti_{(1-x2)}BN$, and $Al_{x2}Ti_{(1-x2)}CN$,
the matrix region has a structure in which a third layer and a fourth layer are layered on each other, the third layer being composed of at least one third AlTi compound selected from a group consisting of $Al_{x3}Ti_{(1-x3)}N$, $Al_{x3}Ti_{(1-x3)}BN$, and $Al_{x3}Ti_{(1-x3)}CN$, the fourth layer being composed of at least one fourth AlTi compound selected from a group consisting of $Al_{x4}Ti_{(1-x4)}N$, $Al_{x4}Ti_{(1-x4)}BN$, and $Al_{x4}Ti_{(1-x4)}CN$,
the first AlTi compound has a hexagonal crystal structure, and the second AlTi compound has a cubic crystal structure, the third AlTi compound has a hexagonal crystal structure, and the fourth AlTi compound has a cubic crystal structure, x1 is more than or equal to 0.89 and less than or equal to 0.97, x2 is more than or equal to 0.5 and less than or equal to 0.61, x3 is more than or equal to 0.86 and less than or equal to 0.95, and x4 is more than or equal to 0.5 and less than or equal to 0.65.

2. The surface-coated cutting tool according to claim 1, wherein the domain region includes a twin crystal portion.

3. The surface-coated cutting tool according to claim 1, wherein a total thickness of a thickness of the first layer and a thickness of the second layer is more than or equal to 2 nm and less than or equal to 20 nm.

4. The surface-coated cutting tool according to claim 1, wherein a total thickness of a thickness of the third layer and a thickness of the fourth layer is more than or equal to 1.5 nm and less than or equal to 30 nm.

5. A method for manufacturing the surface-coated cutting tool recited in claim 1, the method comprising:

preparing the substrate; and emitting first gas, second gas, and third gas to the substrate in an atmosphere at more than or equal to 650° C. and less than or equal to 900° C. and under more than or equal to 0.5 kPa and less than or equal to 5 kPa, the first gas including aluminum halide gas and titanium halide gas, the second gas including aluminum halide gas, titanium halide gas, and ammonia gas, the third gas including ammonia gas.

* * * * *